United States Patent [19]

Ozawa

[11] Patent Number: 4,955,132

[45] Date of Patent: Sep. 11, 1990

[54] METHOD FOR MOUNTING A SEMICONDUCTOR CHIP

[75] Inventor: Kazuhito Ozawa, Nara, Japan

[73] Assignee: Sharp Kabushiki Kaisha, Osaka, Japan

[21] Appl. No.: 271,256

[22] Filed: Nov. 15, 1988

[30] Foreign Application Priority Data

Nov. 16, 1987 [JP] Japan .................................. 62-288788

[51] Int. Cl.[5] ............................................ H05K 3/34
[52] U.S. Cl. ...................................... 29/840; 174/260; 357/70
[58] Field of Search .......................... 29/840; 174/68.5; 357/70

[56] References Cited

U.S. PATENT DOCUMENTS

| 3,832,769 | 9/1974 | Olyphant, Jr. et al. | 357/70 X |
| 3,868,724 | 2/1975 | Perrino | 357/70 X |
| 4,157,932 | 6/1979 | Hirata | 174/68.5 X |
| 4,336,551 | 6/1982 | Fujita et al. | 174/68.5 X |
| 4,617,729 | 10/1986 | Celnik | 29/840 |
| 4,654,752 | 3/1987 | Kyle | 29/840 X |

FOREIGN PATENT DOCUMENTS 52-40972  3/1977  Japan ...................................... 357/70

OTHER PUBLICATIONS

IBM Tech. Disclosure Bull., vol. 15, No. 2, Jul. 1972, p. 420, by O. Abolafia.

Primary Examiner—Carl J. Arbes
Attorney, Agent, or Firm—Irell & Manella

[57] ABSTRACT

A method for mounting a semiconductor chip on a circuit board is provided that comprises forming a wiring pattern, which is to be connected with electrodes of the semiconductor chip, on the circuit board; attaching an insulating film, which has at least one hole that fits the shape of the electrodes of the semiconductor chip, to the top of the wiring pattern and the exposed portion of the circuit board; filling the hole formed in the insulating film with a conductor; and placing the semiconductor chip on the insulating film, so that the electrodes of the semiconductor chip are connected electrically with the wiring pattern on the circuit board through the conductor.

8 Claims, 3 Drawing Sheets

METHOD FOR MOUNTING A SEMICONDUCTOR CHIP

BACKGROUND OF THE INVENTION

1. Field of the invention:

This invention relates to a method for mounting semiconductor chips.

2. Description of the prior art:

In general, a method for mounting semiconductor chips in which the semiconductor chips are mounted on a circuit board by the direct-bonding technique is useful for the manufacture of thin, lightweight products such as IC cards and the like. When a large number of electrodes are present on the semiconductor chips to be mounted, the direct-bonding technique is superior to the wire-bonding technique in terms of mounting rate, mounting accuracy, and so on, so that it has been used extensively in a wide variety of applications.

The conventional method for mounting semiconductor chips by the direct-bonding technique comprises forming solder bumps projecting on the semiconductor chips or on the wiring pattern so that the electrodes of the semiconductor chips are connected electrically with the wiring pattern.

When the semiconductor chips are mounted with these solder bumps, it is necessary to mount the semiconductor chips at a fixed height with respect to the wiring pattern so that electrical shorts do not occur between the semiconductor chips on the circuit board and the wiring pattern. However, in the conventional mounting method in which these solder bumps are formed, the time-consuming processes of thin-film metal vapor deposition, metal plating, and the like are required, and these processes greatly increase the cost of production, preventing the widespread application of this method.

SUMMARY OF THE INVENTION

The method for mounting a semiconductor chip on a circuit board of this invention, which overcomes the above-discussed and numerous other disadvantages and deficiencies of the prior art, comprises forming a wiring pattern, which is to be connected with electrodes of the semiconductor chip, on the circuit board; attaching an insulating film, which has at least one hole that fits the shape of the electrodes of the semiconductor chip, to the top of the wiring pattern and the exposed portion of the circuit board; filling the hole formed in the insulating film with a conductor; and placing the semiconductor chip on the insulating film, so that the electrodes of the semiconductor chip are connected electrically with the wiring pattern on the circuit board through the conductor.

In a preferred embodiment, the insulating film has a film surface area that is the same as or larger than the chip surface area of the semiconductor chip.

In a preferred embodiment, the insulating film is attached to the top of the wiring pattern and the exposed portion of the circuit board by the application of heat and pressure.

In a preferred embodiment, the conductor is constructed of one portion of the wiring pattern.

In a preferred embodiment, the insulating film is attached to the surface of the wiring pattern and the exposed portion of the circuit board by use of an adhesive agent.

Thus, the invention described herein makes possible the objectives of (1) providing a method for mounting semiconductor chips in which the electrodes of the semiconductor chips can readily be connected to the wiring pattern without forming solder bumps, so that the cost of production is reduced; (2) providing a method for mounting semiconductor chips in which an insulating film is formed on top of the circuit board together with the wiring pattern wherein the insulating film has a film surface area that is the same as or larger than the chip surface area of the semiconductor chips, so that there is no danger of electrical shorts between the edge portions of the semiconductor chips and the wiring pattern; and (3) providing a method for mounting semiconductor chips that permits a satisfactory mounting rate and mounting accuracy because the electrodes of the semiconductor chip are connected electrically at a time with the wiring pattern on the circuit board by means of a conductor that fills each of the holes of the insulating film.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
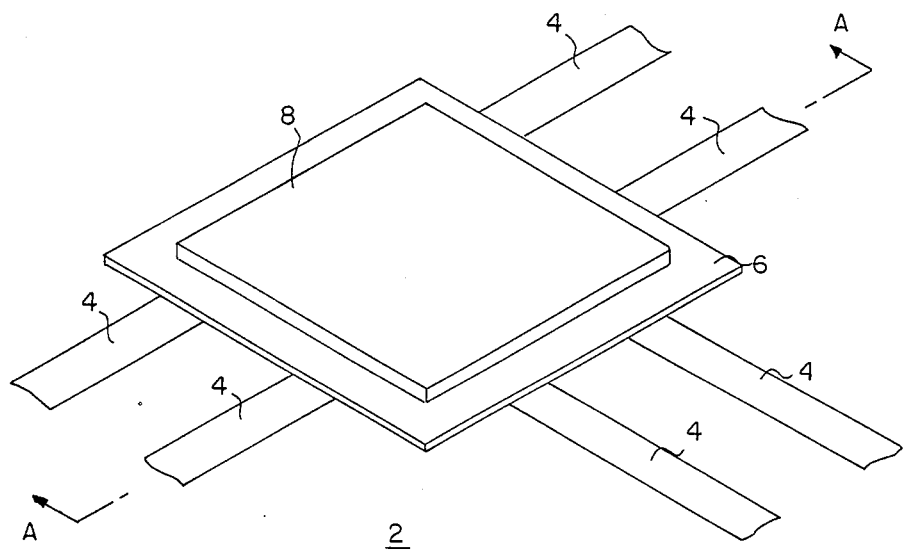
FIG. 1 is a perspective view of a semiconductor chip mounted on a circuit board by the mounting method of this invention.
Figure 2:
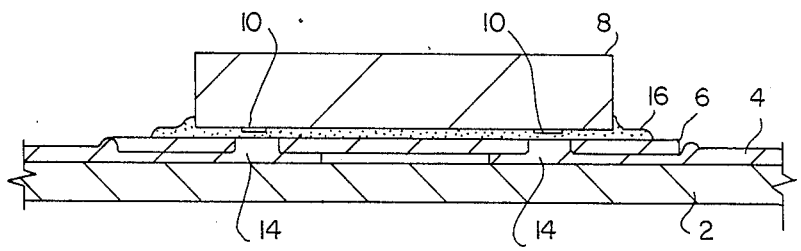
FIG. 2 is a sectional view taken along line A—A of FIG. 1.
Figure 3:
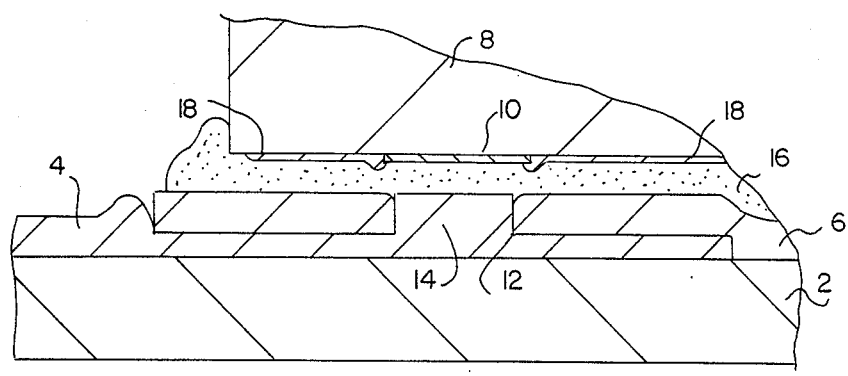
FIG. 3 is an enlarged fragmentary sectional view of FIG. 2.

FIG. 1 is a perspective view of a semiconductor chip mounted on a circuit board by the mounting method of this invention. FIG. 2 is a sectional view taken along line A—A of FIG. 1. FIG. 3 is an enlarged fragmentary sectional view of FIG. 2. In these figures, reference numeral 2 is a circuit board made of polyester film on which there is formed a wiring pattern to be connected with the electrodes of the semiconductor chip, reference numeral 4 is a wiring pattern formed on top of the circuit board 2 by the screen-printing technique with conductive ink, reference numeral 6 is a thin insulating film formed on top of the circuit board 2 together with the wiring pattern 4, and reference numeral 8 is a semiconductor chip.

The insulating film 6 has a film surface area that is the same as or larger than the chip surface area of the semiconductor chip 8. The insulating film 6 has at least one hole 12 that fits the shape of the electrode 10 of the semiconductor chip 8. The hole 12 formed in this insulating film 6 is filled with a conductor 14 that connects the electrode 10 of the semiconductor chip 8 and the wiring pattern 4 on the circuit board 2. This conductor 14 is constructed of one portion of the wiring pattern 4. In the space between the semiconductor chip 8 and the conductor 14, there is an anisotropic conductive adhesive layer 16, and the conductor 14 connects the electrode 10 of the semiconductor chip 8 indirectly to the wiring pattern 4 by means of this anisotropic conductive adhesive layer 16. Reference numeral 18 is a surface-protective film provided on the undersurface of the semiconductor chip.

With the mounting method of this invention, there is no danger of electrical shorts between the edge portions of the semiconductor chip 8 and the wiring pattern 4, because the film surface area of the insulating film 6 is the same as or larger than the chip surface area of the semiconductor chip 8. Also, by means of the conductor 14 that fills each of the holes 12 formed in the insulating film 6, the electrode 10 of the semiconductor chip 8 and the wiring pattern 4 on the circuit board 2 are connected electrically with each other at a time.

The steps of the mounting method mentioned above will hereinafter be described with reference to FIGS. 4 and 5.

Figure 4A:
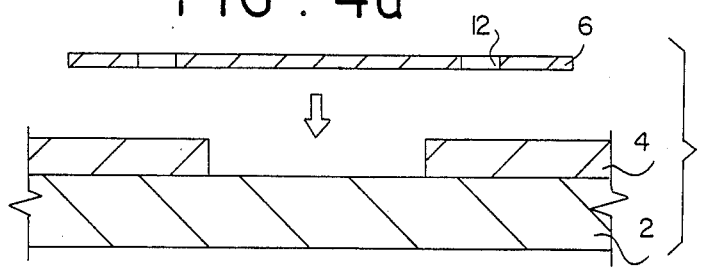
FIG. 4a–4b is a series of sectional views showing the mounting steps in the mounting method of this invention.
Figure 4B:
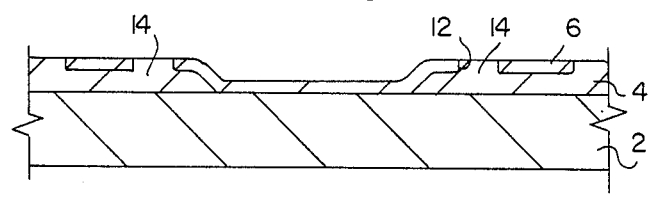

First of all, as shown in FIG. 4a, a circuit board 2 is provided on which a wiring pattern 4 is formed by the screen-printing technique with conductive ink. Then, on top of the prepared circuit board 2, a flexible polyester insulating film 6 that has holes therein is placed in the direction shown by the arrow of FIG. 4a. After this insulating film 6 has been placed on top of the circuit board 2, by the addition of heat and pressure, the insulating film 6 is made to adhere to the top of the wiring pattern 4 and the exposed portion of the circuit board 2 as shown in FIG. 4b. At the time of this adhesion, the insulating film 6 is fixed to the top of the wiring pattern 4 by means of fusion with heat of a binder resin that is contained in conductive ink. Also, the conductive ink that has been melted with heat is introduced into the holes 12 that were already formed in the insulating film 6. With this introduction, the conductive ink forms the conductor 14.

Next, an anisotropic conductive adhesive agent 16 containing metal particles with the maximum diameter of 10 μm or less, and with the mean diameter of approximately 5 μm, which adhesive agent is either thermosoftening or thermohardening, is applied to the required places on the circuit board 2 and the wiring pattern 4 at the thickness of 5 to 9 μm. Then, the semiconductor chip 8, on the undersurface of which is provided a surface-protective film 18, is placed on the wiring pattern 4 so that the electrode 10 of the semiconductor chip 8 faces the hole 12 of the insulating film 6 through the anisotropic conductive adhesive layer 16. The anisotropy of the conductive adhesive layer 16 acts to connect the conductor 14 with the electrode 10 of the semiconductor chip 8.

In this way, the mounting of the semiconductor chip in this example as is shown in FIGS. 1 to 3 is accomplished.

FIG. 5 is a series of sectional views for the explanation of other mounting steps of the mounting method of this invention. First, a wiring pattern 4 made of metal foil is prepared on a circuit board 2. As is shown in FIGS. 5a and 5b, an insulating film 6 on the undersurface of which a hot-melt adhesive layer 20 has been provided is placed on the circuit board 2 and the wiring pattern 4. Then, by the application of heat and pressure to the insulating film 6, this insulating film 6 is fixed to the surface of the wiring pattern 4 and the exposed portion of the circuit board 2.

Figure 5A:
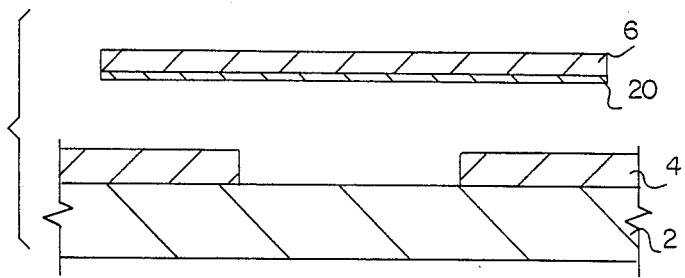
FIG. 5a–5d is a series of sectional views showing other mounting steps of the mounting method of this invention.
Figure 5B:
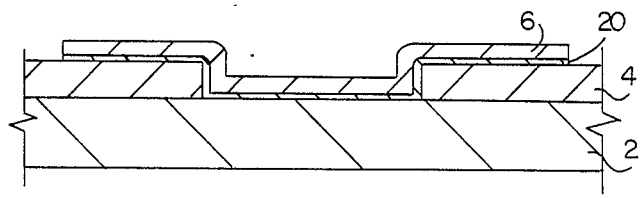
Figure 5C:
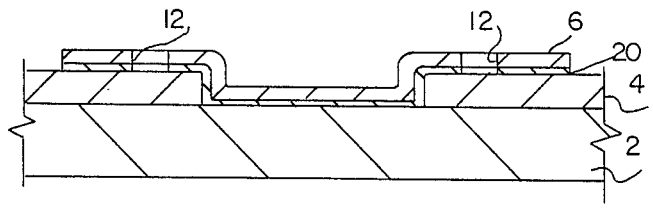

Next, as shown in FIG. 5c, the required holes 12 are formed in the insulating film 6 and the hot-melt adhesive layer 20 by an appropriate hole-opening technique so that each of the holes 12 faces the electrode 10 of the semiconductor chip 8. For this hole-opening technique, it is possible to use the method of fusion with heat of the insulating film 6 by use of an ultrasonic generating head or a thermo-compression bonding head; the method in which infrared radiation is applied through a mask; the method in which holes are burned at the desired places in the insulating film 6 by use of a laser beam, and the like.

Figure 5D:
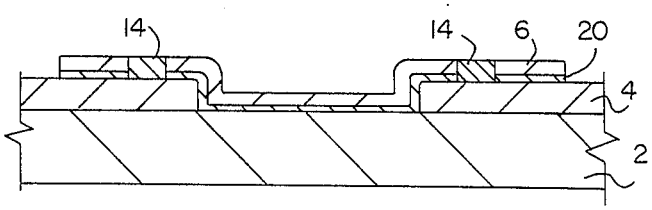

The holes 12 that have been opened in the insulating film 6 are filled with conductive ink to form conductors 14, as shown in FIG. 5d. As the method for the formation of the conductor, it is possible to use the method in which a uniform layer of conductive ink is formed over the entire surface, and the unnecessary areas of conductive ink are removed by use of a brush, etc.; the method in which the entire surface is covered with a heat-transfer film obtained by the application of a conductive hot-melt adhesive to a metal film, and the heat-transfer film is transferred to the wiring pattern 4 in the hole 12 of the insulating film 6; the method for the direct injection of conductive ink into the hole 12 of the insulating film 6 by means of a nozzle that has a sharp tip, and the like.

Finally, in the same way as in the above example, the semiconductor chip is mounted on the insulating film 6 by use of the anisotropic conductive adhesive agent.

In this way, the mounting of the semiconductor chip in this example is accomplished.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for mounting a semiconductor chip on a circuit board, which comprises:
   forming a wiring pattern, which is to be connected with electrodes of the semiconductor chip, on the circuit board;
   attaching an insulating film, which has at least one hole that fits the shape of said electrodes of the semiconductor chip, to the top of said wiring pattern and the exposed portion of said circuit board;
   filling said hole formed in said insulating film with a conductor; and
   placing said semiconductor chip on said insulating film and connecting electrodes of the semiconductor chip electrically with said wiring pattern on the circuit board through said conductor by use of a conductive adhesive agent.

2. A method for mounting a semiconductor chip on a circuit board according to claim 1, wherein said insulating film has a film surface area that is the same as or larger than the chip surface area of said semiconductor chip.

3. A method for mounting a semiconductor chip on a circuit board according to claim 1, wherein said wiring pattern is made of metal foil.

4. A method for mounting a semiconductor ship on a circuit board according to claim 3, wherein said conductor is formed with conductive ink.

5. A method for mounting a semiconductor chip on a circuit board according to claim 3, wherein said insulating film is attached to the surface of said wiring pattern and the exposed portion of said circuit board by use of an adhesive agent.

6. A method for mounting a semiconductor chip on a circuit board according to claim 1, wherein said wiring pattern is formed with conductive ink.

7. A method for mounting a semiconductor chip on a circuit board according to claim 6, wherein said insulating film is attached to the top of said wiring pattern and the exposed portion of said circuit board by the application of heat and pressure.

8. A method for mounting a semiconductor chip on a circuit board according to claim 6, wherein said conductor is constructed of one portion of said wiring pattern.

* * * * *